(12) United States Patent
Bergman

(10) Patent No.: US 7,279,431 B2
(45) Date of Patent: Oct. 9, 2007

(54) VAPOR PHASE ETCHING MEMS DEVICES

(75) Inventor: Eric J. Bergman, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 572 days.

(21) Appl. No.: 10/464,597

(22) Filed: Jun. 18, 2003

(65) Prior Publication Data

US 2004/0259370 A1 Dec. 23, 2004

(51) Int. Cl.
*H01L 21/302* (2006.01)

(52) U.S. Cl. .................. 438/745; 438/706; 216/73

(58) Field of Classification Search ........... 438/745, 438/747, 748, 756, 706; 216/58, 79, 63, 216/73; 134/2, 31, 32, 36
See application file for complete search history.

(56) References Cited

U.S. PATENT DOCUMENTS

| | | | |
|---|---|---|---|
| 5,232,511 A | 8/1993 | Bergman | |
| 5,235,995 A | 8/1993 | Bergman et al. | |
| 5,238,500 A | 8/1993 | Bergman | |
| 5,332,445 A | 7/1994 | Bergman | |
| 5,370,741 A | 12/1994 | Bergman | |
| 6,162,734 A * | 12/2000 | Bergman et al. | 438/706 |
| 6,497,768 B2 | 12/2002 | Bergman | |
| 6,576,489 B2 * | 6/2003 | Leung et al. | 438/52 |
| 6,806,205 B2 * | 10/2004 | Jang et al. | 438/745 |
| 6,830,950 B2 * | 12/2004 | Chinn et al. | 438/52 |
| 6,875,289 B2 * | 4/2005 | Christenson et al. | 134/36 |
| 2003/0124848 A1 * | 7/2003 | Chinn et al. | 438/689 |
| 2004/0033639 A1 * | 2/2004 | Chinn et al. | 438/59 |
| 2004/0139987 A1 * | 7/2004 | Mount | 134/1.3 |

* cited by examiner

*Primary Examiner*—Kin-Chan Chen
(74) *Attorney, Agent, or Firm*—Perkins Coie LLP

(57) ABSTRACT

An etch release for a MEMS device on a substrate includes etching the substrate with an etchant vapor and a wetting vapor. A thermal bake of the MEMS device, after the etch release may be used to volatilize residues. A supercritical fluid may also be used to remove residual contaminants. The combination of the etchant vapor, such as HF, and the wetting vapor, such as an alcohol vapor, improves the uniformity of the etch undercut on the substrate.

15 Claims, 5 Drawing Sheets

Batch

Single Wafer

VAPOR PHASE ETCHING MEMS DEVICES

BACKGROUND OF THE INVENTION

Micro Electro Mechanical Systems (MEMS) generally relate to the integration of mechanical elements, sensors, actuators, and/or electronics onto a support structure, such as a silicon substrate or wafer. Some common examples of MEMS devices include miniature engines, laser beam splitters, air bag accelerometers, mirror arrays, and ink jet heads for printers. Many of these systems have device structures or components that are moveable, or that must otherwise be detached from the MEMS device support structure to function properly.

A significant difficulty in manufacturing MEMS devices is "stiction," which is the adhesion of a micro movable component to another structure, such as a support substrate. Stiction occurs in a MEMS device when a component on the device has been detached from its support structure, and surface tension of a surrounding fluid used in the manufacturing process distorts the component so that the components bend and stick to one or more other surfaces. If stiction occurs, the MEMS device is generally defective. The device must then be repaired, which can be expensive and time-consuming, or it is discarded.

Aqueous liquids, which are typically used in the manufacturing of MEMS devices, have a strong tendency to cause stiction. Consequently, in the manufacture of MEMS devices, efforts are generally made to perform a "release etch" of the moveable components on the device, and to perform all subsequent processing as well, in a way which will avoid stiction. Techniques commonly used have included the use of plasma etches, vapor etches, and supercritical fluid exposure.

Hydrofluoric acid (HF) vapor etching has been used to perform the release etch, without causing stiction. In the case of fluorine based etchants, such as HF, the release layer to be etched is usually silicon dioxide. The key to successful vapor phase etching, without creating stiction, is to control the formation of a condensate film that forms on the MEMS device. Vapor phase etching occurs as the vapor condenses on the device surface. If too much condensate forms, a liquid boundary layer on the device will become thick enough to cause stiction. If insufficient condensate forms, conversely, the etch rate will typically be too low for practical application in device manufacture, and process uniformity may be poor since the boundary layer is not fully developed, resulting in large variations across the wafer and from one wafer to another.

While HF vapor has been successful at etching silicon dioxide films, there are often other materials present during the etch. Some of these may etch to a greater or lesser degree, and may contribute to the formation of other reaction products, which are often undesirable. In general, a desired reaction for etching silicon dioxide with HF is:

$$4HF + SiO_2 \rightarrow SiF_4 + 2H_2O$$

Control of the etching rate is important to ensure that excess water does not form so rapidly that it interferes with the etching process. Since $SiF_4$ is a gas, the etching process may proceed without being impeded by the formation of solids or liquids, which would otherwise interfere with mass transport mechanisms. However, other elements that might be present include dopants, such as boron, phosphorous, and/or arsenic, as well as materials such as silicon nitride. Competing side-reactions might also form compounds such as $H_2SiF_6$, or other similar compounds.

In many cases, the formation of these additional compounds or contaminants will interfere with the desired etching process to an unacceptable degree. Moreover, these contaminants may render the MEMS devices damaged or completely inoperable. It is typically time-consuming and expensive to effectively clean and/or repair a MEMS device that has been damaged by contaminants. Accordingly, there is an important need for better methods for manufacturing MEMS devices.

SUMMARY OF THE INVENTION

It has now been discovered that significant improvements in the manufacturing of MEMS devices can be achieved via use of an etchant vapor in combination with a wetting vapor. When used in a release etch, this combination of etchant and wetting vapors helps to minimize stiction. As a result, far fewer MEMS devices manufactured using this new process are defective.

The invention relates to methods for removing contaminants, which form during vapor etching, from a MEMS device manufactured on a substrate. The contaminants that form during vapor etching of a MEMS substrate may damage or destroy the MEMS devices. Thus, the invention significantly reduces or eliminates these contaminants and provides for the efficient and cost-effective manufacture of the MEMS devices.

In one method of the invention, MEMS substrates are placed into a process chamber. An etchant vapor and a wetting vapor are introduced into the chamber, to perform an etch release step. The etchant vapor provides etching, and the wetting vapor improves etching uniformity and reduces contamination.

In another form of the invention, a MEMS substrate is etched with a vapor etchant. Rinse water is sprayed onto the MEMS substrate to remove contaminants. The rinsing step is performed before one or more components on the MEMS device detach, or "release," from the substrate, so that stiction does not occur. Vapor etching is then continued, at least until the component detaches from the substrate. A wetting vapor may also be used. The MEMS device may then optionally be subjected to thermal baking in order to volatilize and remove contaminants from the device.

Alternatively, the MEMS device can be exposed to a supercritical fluid after the substrate is subjected to vapor etching, in order to remove additional contaminants from the device. The supercritical fluid may be provided before, during, and/or after the device components detach or release from the substrate.

These aspects improve the efficiency and reliability of processing the MEMS device by reducing or eliminating contaminants that typically form during vapor etching of the substrate.

Any of the described processes may be combined and/or repeated one or more times to achieve optimal contaminant removal results. Other features and advantages of the invention will appear hereinafter. The invention resides as well in sub-combinations of the features described.

BRIEF DESCRIPTION OF THE DRAWINGS

In the drawings, wherein the same reference number indicates the same element throughout the several views.

DETAILED DESCRIPTION OF THE DRAWINGS

A vapor etch of a MEMS device is achieved using an etchant vapor and a wetting vapor. A deionized water rinse step or a thermal bake step may optionally be used.

The methods for processing micro electro mechanical systems (MEMS) described herein may be performed in a variety of processing systems. Processing systems similar to those used to process semiconductor wafers, for example, may be used to process MEMS devices, which are typically mounted on substrates similar to semiconductor wafers. Moreover, one or more processing systems may be used to perform the various processing steps described herein. Thus, the processing system 10 described below is only one example of a processing system that could be used to process MEMS devices according to the claimed methods.

Figure 1:
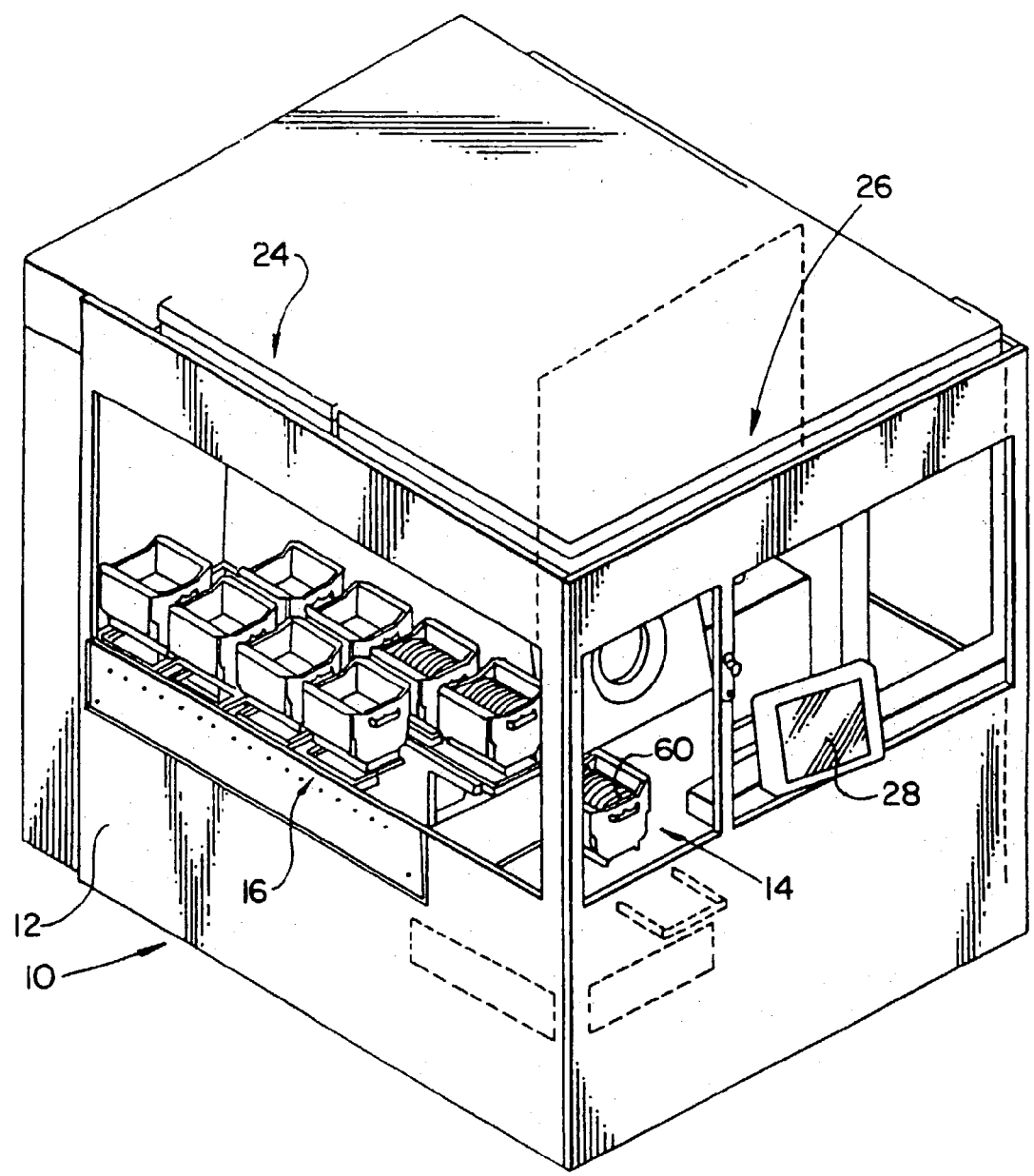
FIG. 1 is a perspective view of a MEMS device processing system.
Figure 2:
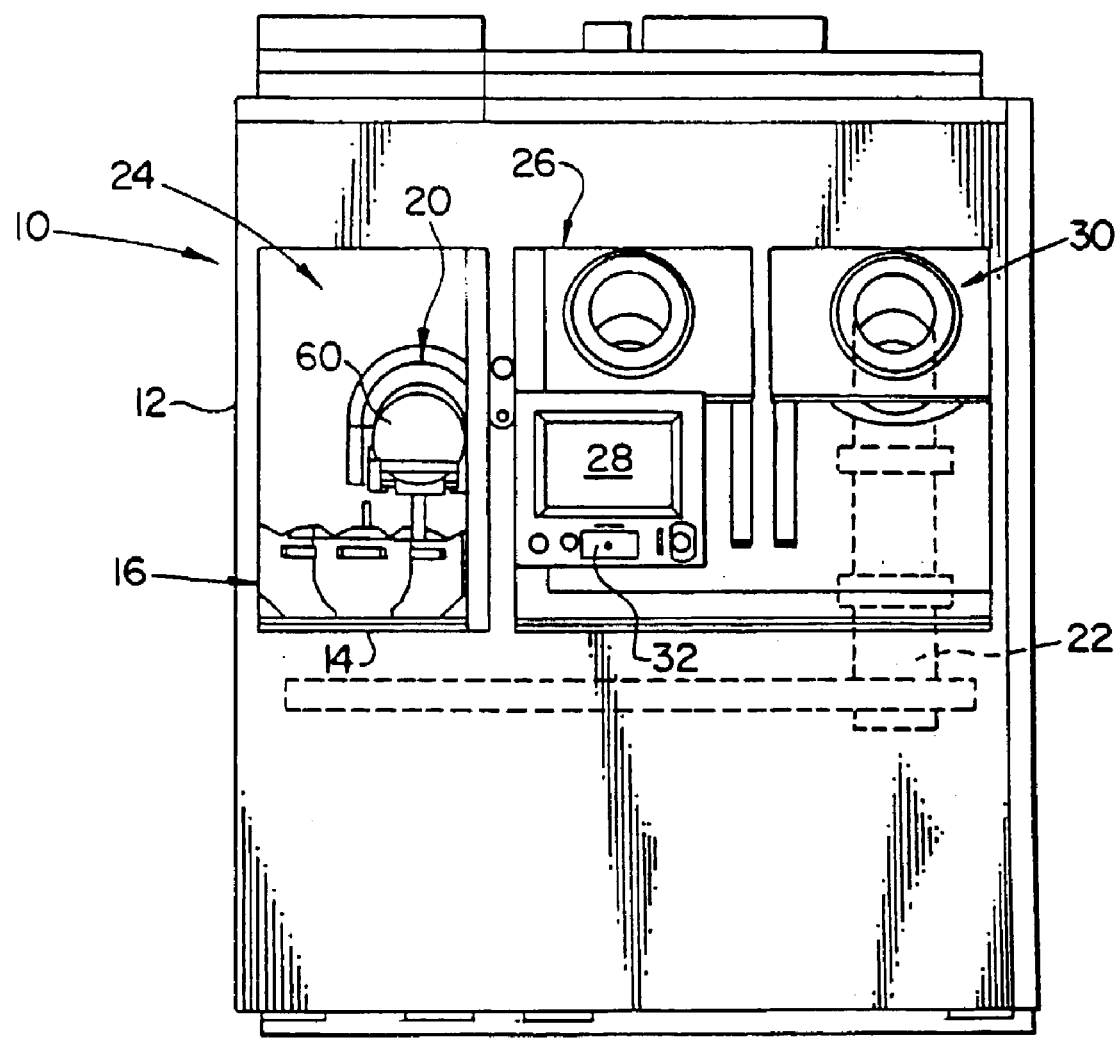
FIG. 2 is a front view of the MEMS device processing system of FIG. 1.

Turning now in detail to the drawings, as shown in FIGS. 1 and 2, a surface processing system 10 preferably includes an enclosure 12 to maintain and control clean airflow and reduce contamination of MEMS devices being processed in the processing system 10. For ease of description, the MEMS devices, in conjunction with their respective support substrates, will be referred to as "workpieces" herein. An input/output station 14 at the front of the system 10 allows workpieces 60 to be loaded and unloaded to and from the system 10. An indexer 16, or other temporary workpiece storage station, is preferably provided adjacent to the input/output station 14.

The system 10 may be divided into an interface section 24 and a process section 26. These sections may be separated by a partition having a door opening. The interface section 24 includes the input/output station 14 and the indexer 16. The process section 26 includes one or more process stations 30, with each process station 30 including a MEMS processor. The interface section 24 also preferably includes a process robot 22 for moving workpieces 60 between the indexer 16 and the processor unit. A control panel 28 may be provided on the enclosure 12, to allow instructions or programming to be input into a computer controller 32 which controls the system 10.

The MEMS workpieces 60 may be provided in open carriers, cassettes, or trays, and handled as described in U.S. Pat. Nos. 6,279,724 or 5,664,337, both incorporated herein by reference. Alternatively, the workpieces 60 may be provided within sealed pods or containers which are unsealed at a docking station, as described in U.S. Pat. No. 6,447,232 or U.S. patent application Ser. Nos. 09/612,009 or 10/200,074, each incorporated herein by reference.

Figure 3A:
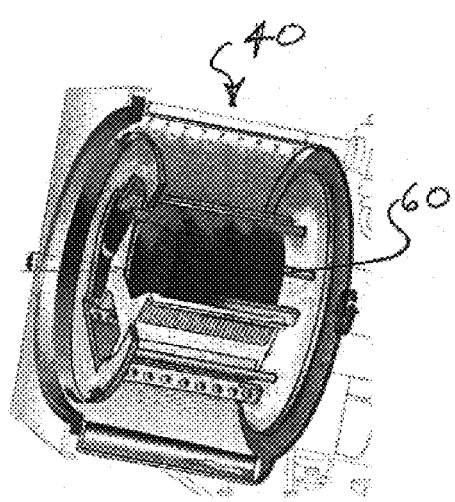
FIG. 3A is perspective view of a batch processor for processing a plurality of MEMS devices.
Figure 3B:
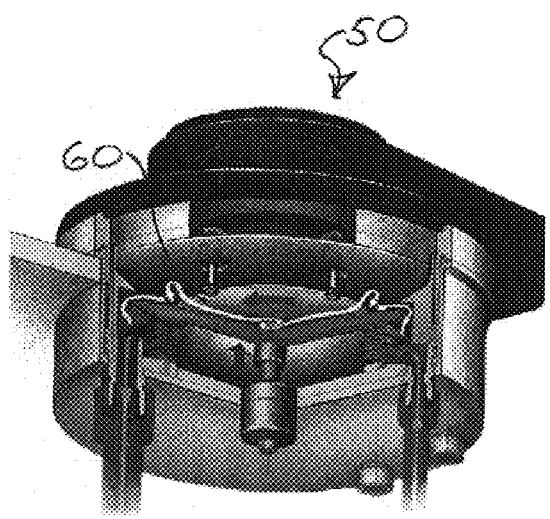
FIG. 3B is a perspective view of a single workpiece processor for processing a single MEMS device.

As illustrated in FIGS. 3A and 3B, the processors 30 in the processing system 10 may be batch processors 40 as described in the patents listed above, or single workpiece processors 50 (for example, as described in U.S. Pat. Nos. 5,431,421 or 6,423,642, incorporated herein by reference), similar to those used in existing semiconductor wafer processing systems. Other variations of batch processors and/or single workpieces processors may also be used. For example, the batch processor 40 shown in FIG. 3A has a 25-workpiece capacity, but other conventional processor sizes, such as a 50-workpiece capacity processor, may alternatively be used.

The processors preferably each include a rotatable workpiece holder or rotor 42, so that the workpieces 60 may be rotated during processing. Rotation of the workpieces 60 may be used for spin-drying the workpieces 60, for distributing process fluids or vapors evenly across the workpiece surfaces, or for other reasons, as is common in the processing of semiconductor wafers.

When processing MEMS devices, batch processing is generally preferred, since the process is often quite lengthy. For example, a typical MEMS device processing cycle may range from 30 minutes to 20 hours. It is therefore advantageous to process several workpieces 60 at one time. Thus, batch processing will generally be referred to herein, although single workpiece processing may also be used.

Figure 4:
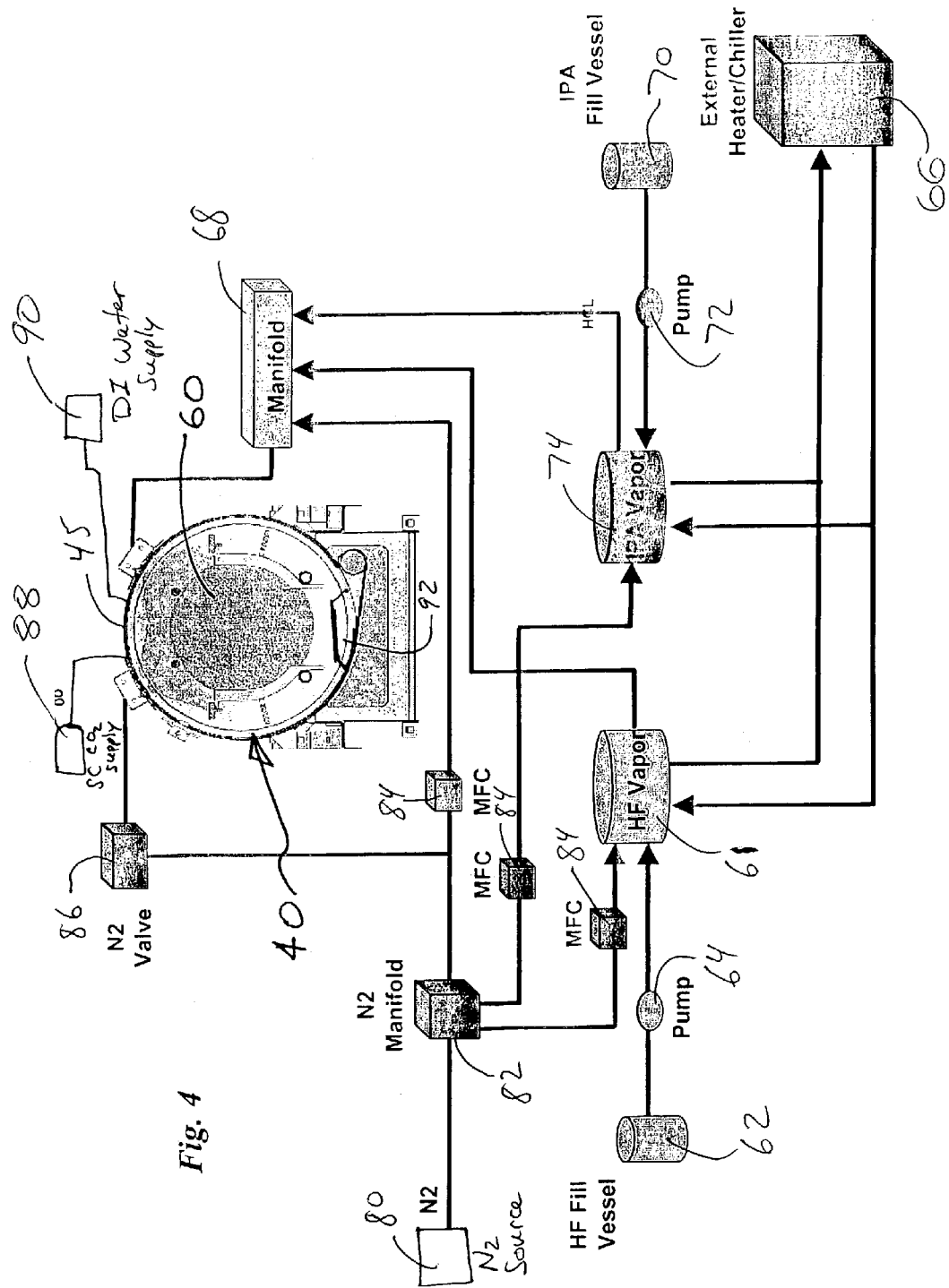
FIG. 4 is a schematic diagram of a preferred MEMS device processing system.

FIG. 4 is a schematic flow diagram of a preferred MEMS device processing system. In operation, one or more MEMS workpieces 60 are loaded into a workpiece holder or rotor in a process chamber 45, which may comprise a batch processor or single workpiece processor, such as those illustrated in FIGS. 3A and 3B. The workpieces 60 may be loaded manually, by a robot, or by another suitable loading device. The workpieces may be handled or contacted directly by the robot or rotor. Alternatively, the workpieces may be handled within a carrier tray or cassette which is placed into the rotor.

The workpieces preferably each have a MEMS device mounted on a substrate. The surface of each substrate preferably includes a film or layer of silicon dioxide, silicon nitride, and/or another similar substance. At least one of the MEMS devices includes one or more moveable components, such as a cantilever arm, that must be detached from the corresponding substrate surface so that the MEMS device may properly function.

Once the workpieces 60 are loaded into the processor, the process chamber 45 is preferably closed, and may optionally form a liquid-tight seal. An etchant vapor, such as HF vapor, is then provided into the process chamber to etch the substrate surfaces supporting the MEMS devices. To form the HF vapor, HF liquid may be provided in a HF fill vessel 62, and then pumped into a HF vaporizer 61 with a pump 64. The HF vaporizer is preferably connected to a heat exchanger 66, which provides heat to the HF vaporizer 61 to convert some portion of the HF liquid into HF vapor. The HF vapor is then provided into the process chamber via a vapor delivery manifold 68, or other suitable device. A vent can be advantageously included to allow gas flow into the processing chamber without pressure buildup, to thereby maintain a desired processing chamber operating pressure. Typically the pressure is at or near atmospheric, although reduced and elevated pressures are alternatively possible. The vapor may be generated as described in U.S. Pat. No. 6,162,734, incorporated herein by reference. Typically, the HF fill vessel 62 is supplied with an etchant mixture of HF and water.

The HF vapor is preferably mixed with nitrogen ($N_2$) gas, or another suitable carrier gas, for delivering the HF vapor into the process chamber 45, as is common in the semiconductor wafer manufacturing industry. The $N_2$ gas may also be used to enhance the processing of the workpieces 60. When used as a carrier gas, the $N_2$ gas passes through the HF vaporizor 61, where it entrains the HF vapors and carries them to the process chamber to react with the silicon dioxide film, or other material to be etched. Other gasses, such as compressed dry air, oxygen, and $CO_2$, could be used instead of $N_2$ gas. N2 gas may also be delivered to the process chamber 45 after the workpieces 60 are processed, in order to purge any remaining HF vapor from the process chamber 45 before the chamber door is opened.

The $N_2$ gas is preferably delivered from an $N_2$ source 80 into an $N_2$ manifold 82. The $N_2$ preferably exits the manifold 82 and is delivered through mass flow controllers (MFCs) 84 to the HF vaporizer 61, and to any other desired system components. The MFCs are preferably electronic devices that control the mass of $N_2$ gas that flows to the other system components. $N_2$ gas may also be delivered from the $N_2$ manifold 82 to a separate $N_2$ valve 86 located outside of the process chamber 45, so that $N_2$ gas may be separately provided into the process chamber 45 to aid in processing the workpieces 60.

A wetting agent vapor, such as isopropyl alcohol (IPA) vapor, is also provided into the process chamber. The IPA vapor forms a microscopic condensate layer on the (typically silicon dioxide) film on the workpiece surface. Water is created as a by-product of the reaction of HF with silicon dioxide. The IPA vapor also acts as a drying agent by bonding with the water. The IPA vapor therefore helps to prevent the formation of macroscopic water condensate that could be detrimental to the workpiece processing. The IPA or wetting vapor also improves the uniformity of the etch undercut. The wetting vapor is preferably mixed with etchant vapor outside of the chamber. Other alcohols, such as methanol, ethanol, or n-propanol, could be used instead of IPA vapor to create the desired vapor.

The IPA vapor is preferably delivered to the process chamber 45 in a manner similar to that used to deliver the HF vapor. Thus, an IPA fill vessel 70, a pump 72, and an IPA vaporizer 74 may be employed to form the IPA vapor. The IPA vaporizer 74 may also be connected to the heat exchanger 66, so that the IPA liquid may be heated into a vapor. $N_2$ gas, or another suitable carrier gas, may then pass through the IPA vaporizer 74 to deliver the IPA vapor to the vapor delivery manifold 68. IPA vapor may also be used as a final drying agent.

The IPA vapor and HF vapor may be mixed with one another in the vapor delivery manifold 68, or may be mixed prior to entering the manifold 68. Alternatively, the IPA vapor may be provided into the process chamber 45 separate from the HF vapor, either through a separate manifold or through a different port in the manifold 68.

Figure 5:
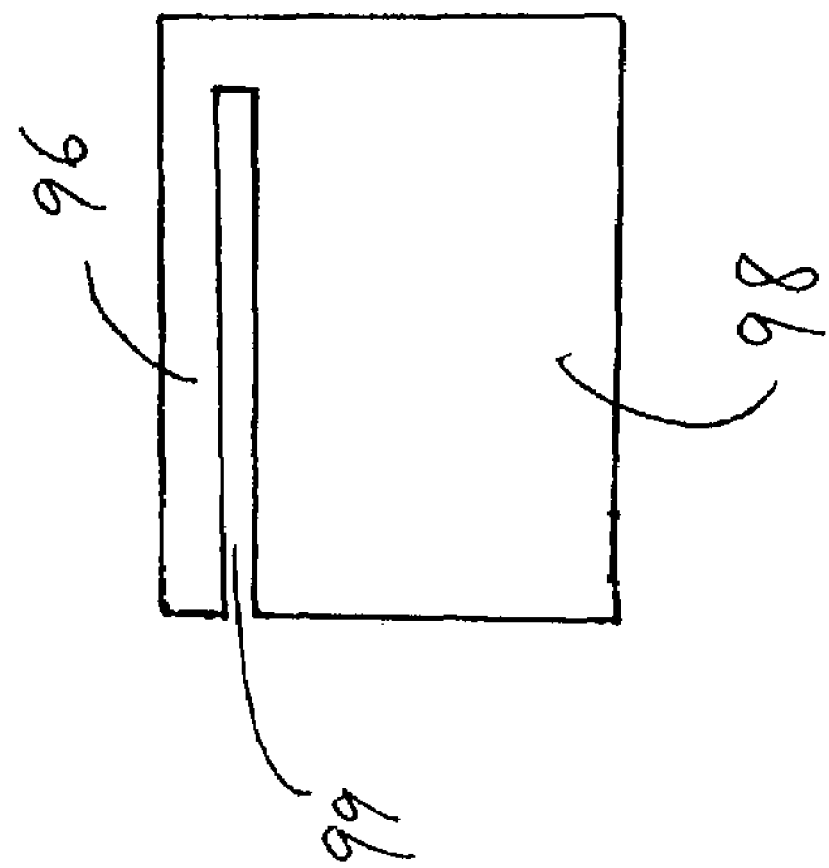
FIG. 5 is a magnified side view of a HF vapor undercut etch of a MEMS device component on a support substrate.

The HF vapor enters the process chamber and begins to etch away the silicon dioxide film on the substrates. The HF vapor etch "undercuts" any detachable components on the MEMS devices, so that the device components can detach or release from their respective support substrates. The HF vapor preferably etches silicon dioxide at a rate of 400 to 1000 or 600 to 800 Å/min FIG. 5 shows an example of a MEMS device component, a cantilevered arm 96 in this case, on a substrate 98 after a release etch of the arm 96 has been performed. Typically, at least 1, 2, 4, 8, 10, 15, 20 microns (including all intermediate ranges) or more of the silicon dioxide or other film must be etched away to cause a device component to detach, or "release," from the substrate surface. It is desirable to prevent aqueous liquid from getting into the space 99 caused by the release etch, which is located between the cantilevered arm 96 and the substrate 98, as this is the region where stiction may occur.

As the etching process continues, residues or contaminants resulting from the etching process typically deposit themselves on the MEMS device. For example, residues from the etched silicon dioxide or silicon nitride film, or from a dopant species, such as boron, phosphorous and arsenic, may be present, and may form other compounds or unwanted contaminants that may be deposited on the MEMS devices. Residues might also occur due to the vapor composition favoring the formation of chemical compounds, such as $H_2SiF_6$.

The residues or contaminants that form during HF vapor etching can damage or render ineffective the MEMS devices. Thus, it is desirable to remove these residues in order to successfully manufacture the MEMS devices. A first method to eliminate these residues or contaminants includes following the HF vapor etch with a deionized (DI) water rinse of the MEMS device and its support substrate. The DI rinse water removes residues and contaminants without damaging the MEMS device. The DI rinse water may be supplied from a DI water supply 90 to the process chamber via nozzles in the process chamber, or via another suitable delivery system.

The DI rinse, if used, should be performed before the moveable MEMS device components detach or release from the support substrate, because once release occurs, the DI rinse water may cause stiction. Again, the degree of etch undercut required to release components may range from 1 micron to in excess of 20 microns (e.g., 1–30; 2–24; 4 or 5–20; or 8–16). Thus, it is preferable, but not required, to discontinue the HF vapor etch before the DI rinse step is performed, in order to ensure that release does not occur during the rinsing process, which would likely lead to stiction. The DI rinse may therefore be used to remove residues and contaminants at any time prior to continuing the HF vapor etch to the point of component release.

In a second method, the etch release using an etchant and wetting vapor is followed by a thermal bake of the MEMS devices to volatilize and remove residues and contaminants. The baking step is preferably performed after the components detach or release from their support substrates. A heater 92 or radiant lamp is preferably located inside, or immediately outside, the process chamber 45 to provide heat for baking. Thermal bake conditions are preferably in the range of 100° C. to 400° C., 150° C. to 350° C., or 200° C. to 300° C., and baking is preferably performed over a duration of 30 to 300, 60 to 200, or 80 to 120 seconds. Under these conditions, the baking process has been shown to reduce residues by 75–90% from the amount of residues present prior to baking.

In a third method, at any time after the vapor etching has begun, the MEMS devices are exposed to a supercritical fluid, such as supercritical $CO_2$ (possibly with additives to enhance cleaning performance), to remove residual contaminants from the MEMS devices. The supercritical fluid exposure is an "all-dry" process, and therefore does not cause stiction. Accordingly, supercritical fluid may be supplied before, during, and/or after the release of the MEMS device components from their respective substrates, and may also be used in a drying process. The supercritical fluid is preferably supplied from a supply vessel 88 into the process chamber 45 via nozzles or another suitable delivery system.

Any of the three methods described above may be combined with one another to further enhance the removal of residues and contaminants from the MEMS devices. The above methods may also be repeated one or more times to increase contaminant removal. Additionally, the methods may be performed in a single processing chamber, or the workpieces may be transferred to a separate chamber for a given processing step.

After the etching and cleaning steps are completed, the workpieces may optionally be subjected to an additional drying process. Any suitable drying process, such as spin-drying or heated air drying, may be employed. Once the workpieces are dry, the process chamber 45 is opened, and the workpieces 60 are removed. The workpieces 60 may be removed manually or by a robot. Once the processed batch of workpieces 60 are removed, a new batch of workpieces may be loaded into the process chamber 45 for processing.

The processing methods described herein significantly reduce the quantity of residues and contaminants present on MEMS devices during processing and manufacturing of the MEMS devices. As a result, substantially fewer MEMS devices are damaged or rendered inoperable during the manufacturing process, as compared to existing processes. Thus, overall throughput and processing efficiency are increased, while processing costs are significantly reduced.

While embodiments and applications of the present invention have been shown and described, it will be apparent to one skilled in the art that other modifications are possible without departing from the inventive concepts herein. The invention, therefore, is not to be restricted except by the following claims and their equivalents.

The invention claimed is:

1. A method of manufacturing a MEMS device on a substrate, comprising the steps of:
   placing the substrate into a process chamber;
   generating an HF etchant vapor from an HF etchant liquid that includes water;
   providing the HF etchant vapor and water vapor into the process chamber;
   providing a wetting vapor into the process chamber, with the chamber substantially at or above ambient pressure;
   etching the substrate until etch release of the MEMS device occurs; and
   purging the vapors from the chamber.

2. The method of claim 1 further comprising the step of baking the device after the component detaches from the substrate to remove additional contaminants from the device.

3. The method of claim 2 further comprising the steps of baking the substrate at a temperature in the range of 100° C. to 400° C.

4. The method of claim 3 wherein the baking step occurs over a time interval of 30 to 300 seconds.

5. The method of claim 1 further comprising the step of heating the substrate in the chamber.

6. The method of claim 1 wherein a thickness of 1 to 20 microns of silicon dioxide film is etched to cause detachment of a MEMS component from the substrate.

7. The method of claim 1 wherein the wetting vapor is an alcohol vapor, further comprising the step of mixing the HF etchant vapor and the alcohol vapor before introducing them into the process chamber.

8. The method of claim 1 further comprising the step of providing nitrogen vapor into the process chamber along with the etchant vapor.

9. The method of claim 1 further comprising rotating the substrate in the chamber.

10. The method of claim 1 wherein the etching is performed at 400–1000 Angstroms per minute.

11. A method of processing a MEMS device on a substrate, the device having a component requiring detachment from the substrate, comprising the steps of:
    placing the substrate into a process chamber;
    forming HF vapor from a liquid that includes HF and water;
    introducing HF vapor and an alcohol vapor into the process chamber to etch a surface of the substrate, with water vapor also introduced into the process chamber with the HF vapor;
    spraying the device with rinse water to remove contaminants from the device;
    discontinuing the spraying step before the component on the device detaches from the substrate;
    reintroducing HF vapor and an alcohol vapor into the process chamber to further etch the surface of the substrate at least until the component on the device detaches from the substrate; and
    purging the HF vapor and alcohol vapors from the chamber.

12. The method of claim 11 further including maintaining the process chamber substantially at or above ambient pressure.

13. A method of manufacturing a MEMS device on a substrate, comprising the steps of:
    placing the substrate into a process chamber;
    flowing a carrier gas over a liquid including HF and water, to form an etchant vapor including HF vapor and water vapor;
    providing the HF etchant vapor and water vapor into the process chamber;
    providing an alcohol vapor into the process chamber;
    maintaining the process chamber substantially at or above ambient pressure;
    etching the substrate until etch release of the MEMS device occurs; and
    purging the vapors from the chamber.

14. The method of claim 13 with the chamber substantially at ambient pressure.

15. The method of claim 13 with the chamber substantially above ambient pressure.

* * * * *